United States Patent
Kern et al.

[11] Patent Number: 6,157,552
[45] Date of Patent: Dec. 5, 2000

[54] SUB-HARMONIC DETECTION AND CONTROL SYSTEM

[75] Inventors: John Michael Kern, Gansevoort; Stanley A. Miske, Jr., Clifton Park; William Herbert Sahm, III, Argyle, all of N.Y.

[73] Assignee: General Electric Company, Schenectady, N.Y.

[21] Appl. No.: 09/466,827

[22] Filed: Dec. 20, 1999

[51] Int. Cl.[7] .............................. H02J 1/02; G05F 1/13; H02M 1/12
[52] U.S. Cl. .......................... 363/39; 323/248; 307/105; 361/85
[58] Field of Search .................................. 363/39, 40, 37, 363/73, 77, 60, 61, 62, 98; 323/248, 348, 233; 324/520, 107; 307/46, 105, 66; 327/17, 107, 172; 361/85, 89; 340/635, 640

[56] References Cited

U.S. PATENT DOCUMENTS

| | | | |
|---|---|---|---|
| 3,401,272 | 9/1968 | Rosa et al. | 323/233 |
| 3,824,449 | 7/1974 | Hase | 323/248 |
| 4,156,175 | 5/1979 | Nissan | 323/248 |
| 4,209,757 | 6/1980 | Becker | 307/105 |
| 4,267,515 | 5/1981 | Terui et al. | 327/17 |
| 4,851,782 | 7/1989 | Jeerings et al. | 324/520 |
| 5,487,016 | 1/1996 | Elms | 702/71 |
| 6,031,749 | 3/2000 | Covington et al. | 363/98 |

Primary Examiner—Shawn Riley
Assistant Examiner—Rajnikant B. Patel
Attorney, Agent, or Firm—Nixon Peabody LLP; Robert M. Schulman; Carl B. Horton

[57] ABSTRACT

A distribution series capacitor control system is provided with a sub-harmonic detection module connected to an input signal and operable to detect the presence of at least two distinct types of sub-harmonic content in the input signal. A logical signal processor is electrically connected to the sub-harmonic detection module, and operates to independently determine the existence of self-excitation during induction motor starting and ferroresonant phenomena based upon the at least two distinct types of sub-harmonic content, respectively. A system controller is electrically connected to the logical signal processor and operates to eliminate effects of self-excitation during induction motor starting and ferroresonant phenomena on the system.

22 Claims, 7 Drawing Sheets

SUB-HARMONIC DETECTION AND CONTROL SYSTEM

BACKGROUND OF THE INVENTION

The present invention generally relates to distribution series capacitor control systems. More particularly, the present invention relates to sub-harmonic and ferroresonance detection systems for preventing damage to the distribution series capacitor control systems and related equipment.

The quality of power distributed through modern electrical distribution systems continues to be an issue concerning operators of large systems. One such power quality problem is known as voltage flicker. Voltage flicker is a voltage dip that is of a magnitude sufficient to have an objectionable effect on other loads connected to the same circuit. The disturbance may be experienced as only blinking lights, but the magnitude and the frequency of the occurrences determine flicker's impact on system users.

FIG. 9 illustrates a common voltage flicker scenario. Flicker-producing loads 910 on system 900 are typically caused by large motors, welders, or arc-furnaces. These loads are characterized by high inrush currents of relatively short duration, as experienced in the starting of a motor. The motor's inrush current is typically of a low power factor, and causes a voltage dip of increasing magnitude along the feeder up to the point of the load's connection. This causes voltage flicker problems between the load and the source 920, which, when severe enough often leads to a complaint 930.

The distribution series capacitor 940 has long been recognized as a cost-effective solution to these types of flicker problems. Unfortunately, distribution-class electrical power lines equipped with a distribution series capacitor are subject to two distinct and damaging phenomena, ferroresonance involving transformers, and selfexcitation of motors during starting. Ferroresonance is an often severe and rapidly building oscillatory overvoltage condition caused by system non-linearities that can appear when power transformer cores saturate. These non-linearities interact with the series capacitor to produce a low-frequency resonant condition, often in response to large inrush currents following breaker operations. Self-excitation of induction motors is a potentially damaging condition that can occur on the same system. The term "self-excitation" refers to sub-harmonic oscillations that may occur in an electric supply circuit that includes series capacitors. The sub-harmonic oscillations result from the interaction between the series capacitors and an induction motor when the motor is in the process of starting. These oscillations are typically characterized by motor starting problems and sustained overcurrent conditions.

When ferroresonance occurs, immediate action must be taken to prevent damage to other equipment. Ferroresonance is a rapidly occurring, high magnitude, and low frequency oscillation capable of reaching power system voltage levels of 100–200% above normal for brief periods. When self-excitation occurs, low-frequency oscillations are produced as the motor starting sequence fails. The motor will search for the proper operating frequency, which will cause large current surges as the shaft acceleration alternates.

Prior attempts to detect these problems included analog filtering and simple timed-level detection methods to make system decisions. Since these detection systems do not differentiate between these two types of sub-harmonic conditions, they can not adequately safeguard the system while simultaneously maximizing efficiency. Further, the prior systems were not designed to act quickly enough to avoid severe ferroresonance conditions.

SUMMARY OF THE INVENTION

Thus, in view of the above discussion, there is a particular need for a sub-harmonic detection system which adequately protects against ferroresonance and self-excitation phenomena in distribution series capacitor control systems. The present invention overcomes the problems of the prior art and provides additional advantages, by independently detecting the presence of ferroresonance and self-excitation phenomena. Such independent detection permits the system to respond to each phenomena individually, thereby increasing effectiveness in elimination the phenomena. Further, the speed of response in the present invention provides critical protection to system equipment. Briefly, in accordance with one embodiment of the present invention, a distribution series capacitor control system is provided with means for detecting the presence of at least two distinct types of sub-harmonic content in an input signal. A logical signal processor is electrically connected to the sub-harmonic detection means and operates to independently determine two distinct types of adverse phenomena associated with the two distinct types of sub-harmonic content, respectively. A system controller is electrically connected to the logical signal processor. The system controller detects and operates to eliminate the effects of two distinct types of adverse phenomena on the distribution series capacitor control system.

BRIEF DESCRIPTION OF THE DRAWINGS

The present invention and its features and advantages can be understood more completely by reading the following Detailed Description in conjunction with the accompanying drawings, in which like reference numerals designate like elements, and in which.

DETAILED DESCRIPTION

Figure 1:
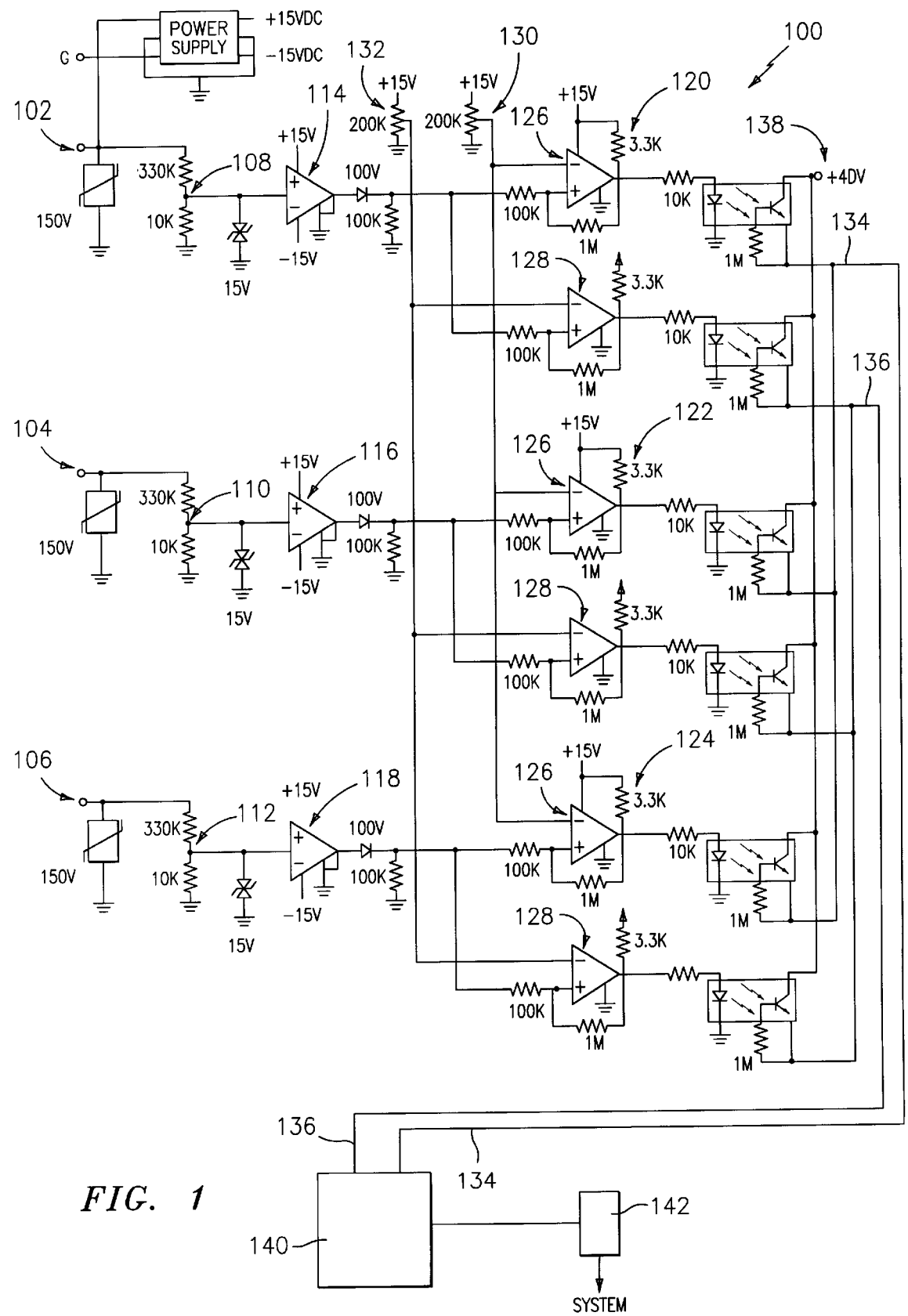
FIG. 1 is a circuit diagram showing one embodiment of a sub-harmonic detection module.

Referring now to FIG. 1, there is shown a circuit diagram of a sub-harmonic detection module 100 according to one embodiment of the present invention. A three phase input signal is presented to the module inputs 102, 104, and 106 via a line-to ground connected utility voltage transformer (not shown). Preferably this signal constitutes a 120 Vrms, power frequency signal on each of the three phases. The signal is resistance divided by resistance dividers 108, 110, and 112 and presented at a safe level to filters 114, 116, and 118, respectively, for signal filtering. Preferably, filters 114, 116, and 118 comprise high order low-pass filters, or other suitable filters, having a cutoff frequency of approximately 40 Hz and a gain of 10x. The outputs of filters 114, 116, and 118 are presented to three sets of digital comparators 120, 122, and 124 where the voltage of the sub-harmonic signal is compared to two distinct predetermined threshold voltages. Each set of comparators includes a self-excitation comparator 126 and a ferroresonance comparator 128. The voltage thresholds for each comparator 126 and 128 are set by potentiometers 130 and 132, respectively. Preferably, the self-excitation comparator 126 is set at 5% of the normal peak voltage signal and the ferroresonance comparator 128 is set at 20% of the normal peak voltage signal.

When the signal supplied to any or all of the self-excitation comparators 126 exceeds the self-excitation threshold voltage, a self-excitation output 134 of the sub-harmonic detection module is activated into an "on" state. Likewise, when the signal supplied to any or all of the ferroresonance comparators 128, a ferroresonance output 136 of the sub-harmonic detection module is activated into an "on" state. For a low-frequency signal of having at least surpassed the self-excitation threshold (e.g., 5% of the normal peak voltage signal), the self-excitation output 134 of module 100 produces a pulse train whose period matches the signal period in the input signal. Similarly, a low-frequency signal having at voltage at least exceeding the ferroresonant threshold (e.g., 20% of the normal peak voltage signal), the ferroresonant output 136 of module 100 produces a similar pulse train. The ferroresonant output 136 and the self-excitation output 134 are whetted by a voltage source 138, preferably a 48 Vdc source, and supplied to a logical processor 140 (see FIG. 2) for additional processing.

Preferably, logical processor 140 is incorporated into a digitally programmable protective relay. Digital protective relays are well-known for monitoring and providing protective control of electrical distribution systems. Such relays are typically connected to a point on the electrical distribution system and monitor current, voltage, or other parameters, and provide protective control (e.g., by providing a control signal to cause power to be removed from the portion of the system with which the relay is associated) in the event that certain specified conditions occur. For example, when a load exceeds certain parameters, the relay is energized to operate a circuit breaker, or the like, coupled to the line to thereby isolate a portion of the electrical distribution system having the fault. The contacts of the relay can perform various functions such as tripping a circuit breaker, generating an alarm or providing a signal to another protective relay.

Recently, "intelligent electronic devices" (IED) including intelligent relays have been developed. IEDs have microprocessors capable of evaluating complex impedance or other variables to protect the electrical distribution system by isolating faults. Typically, substations in an electric power distribution system have many intelligent protective relays and other IEDs. The intelligent relays can be programmed to perform various protection functions. In accordance with the present invention, a suitable digital protective relay incorporates the logical processor 140 and is used to ascertain the presence of ferroresonance and self-excitation phenomena and to generate signals representative of such determinations.

Following operation of the logical processor 140, a signal is sent to a system controller 142 for manipulating the system to eliminate the effects of the self-excitation and/or ferroresonance phenomena.

Figure 2:
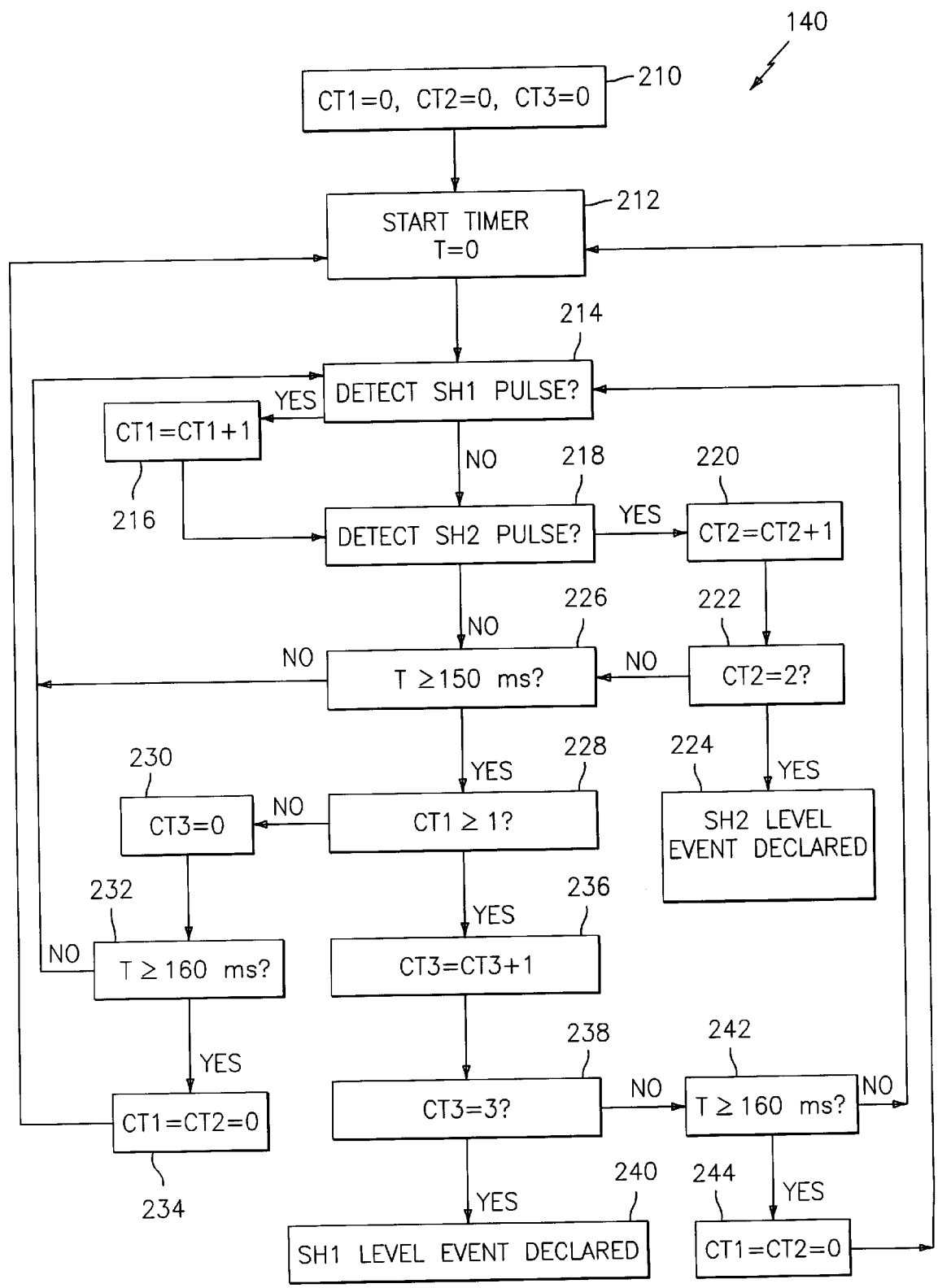
FIG. 2 is a flow chart illustrating the operation of one embodiment of the programmable logical process.

Generally, the logical processor 140 includes a plurality of counters which count both the number of pulses generated by the self-excitation and ferroresonant outputs 134 and 136, respectively, as well as the number of successive runs including at least one self-excitation output pulse. Referring now to FIG. 2, there is shown a flowchart depicting one preferred embodiment of determining ferroresonant and self-excitation events using a variety of counters CT1, CT2, and CT3, and a timer (T). This process can be embodied in a computer-readable storage medium containing instructions for carrying out the various steps. Starting with step 210, the processor 140 sets all of the counters CT1, CT2, and CT3 to 0 and proceeds to step 212, where the timer T is started. The processor then looks for a SH1 (self-excitation) pulse at step 214. If a SH1 pulse is detected, the processor proceeds to step 216 and increments the CT1 counter by one. Regardless of whether a SH1 pulse is detected, the processor proceeds to step 218 where it looks for a SH2 (ferroresonant) pulse. If a SH2 pulse is found, the processor proceeds to step 220 and increments the CT2 counter by one. The processor then proceeds to step 222 where it determines whether the CT2 counter has reached a value of 2. If so, the processor proceeds to step 224 and declares an SH2 level event. An SH2 level event causes the controller 142 to immediately bypass the distribution series capacitor bank in order to avoid damage to additional equipment caused by ferroresonance.

If no SH2 pulse is detected in step 218 or if the value of CT2 is not equal to 2, the processor proceeds to step 226 where it determines whether $T \geq 150$ ms. If not, the processor returns to step 214 and detects additional pulses. If $T \geq 150$ ms, the processor advances to step 228 and determines whether the value of CT1 is at least one. If no SH1 pulses have been detected and CT1=0, the processor proceeds to step 230 where it resets the SH1 group counter CT3 to zero. Counter CT3 is used to increment the number of successive sequences where at least one SH1 pulse is detected. Proceeding to step 232, the processor determines whether $T \geq 160$ ms. If not, the processor returns to step 214 to count any additional pulses. If $T \geq 160$, the processor proceeds to step 234 and resets CT1 and CT2 to zero. It then returns to step 212 where the timer is reset and a new sequence begins.

If, during step 228, it is determined that CT1 is at least 1, the processor proceeds to step 236 where the CT3 counter is incremented by one. In step 238, the processor determines whether the value of CT3 is equal to 3, that is if three successive sequences have registered at least one SH1 pulse. If the value of CT3=3, the processor proceeds to step 240 where a SH1 level event is declared. This causes the controller 142 to implement the control sequence graphically illustrated in FIG. 3 to prevent damage to the system caused by self-excitation.

If the value of CT3 does not equal 3, the processor proceeds to step 242 where it checks to see if $T \geq 160$. If not, the processor returns to step 214 to detect additional pulses. If $T \geq 160$, the processor proceeds to step 244 where the counters CT1 and CT2 are reset to zero. From there, the processor returns to step 212 where the timer is reset and the a new sequence begins.

Figure 3:
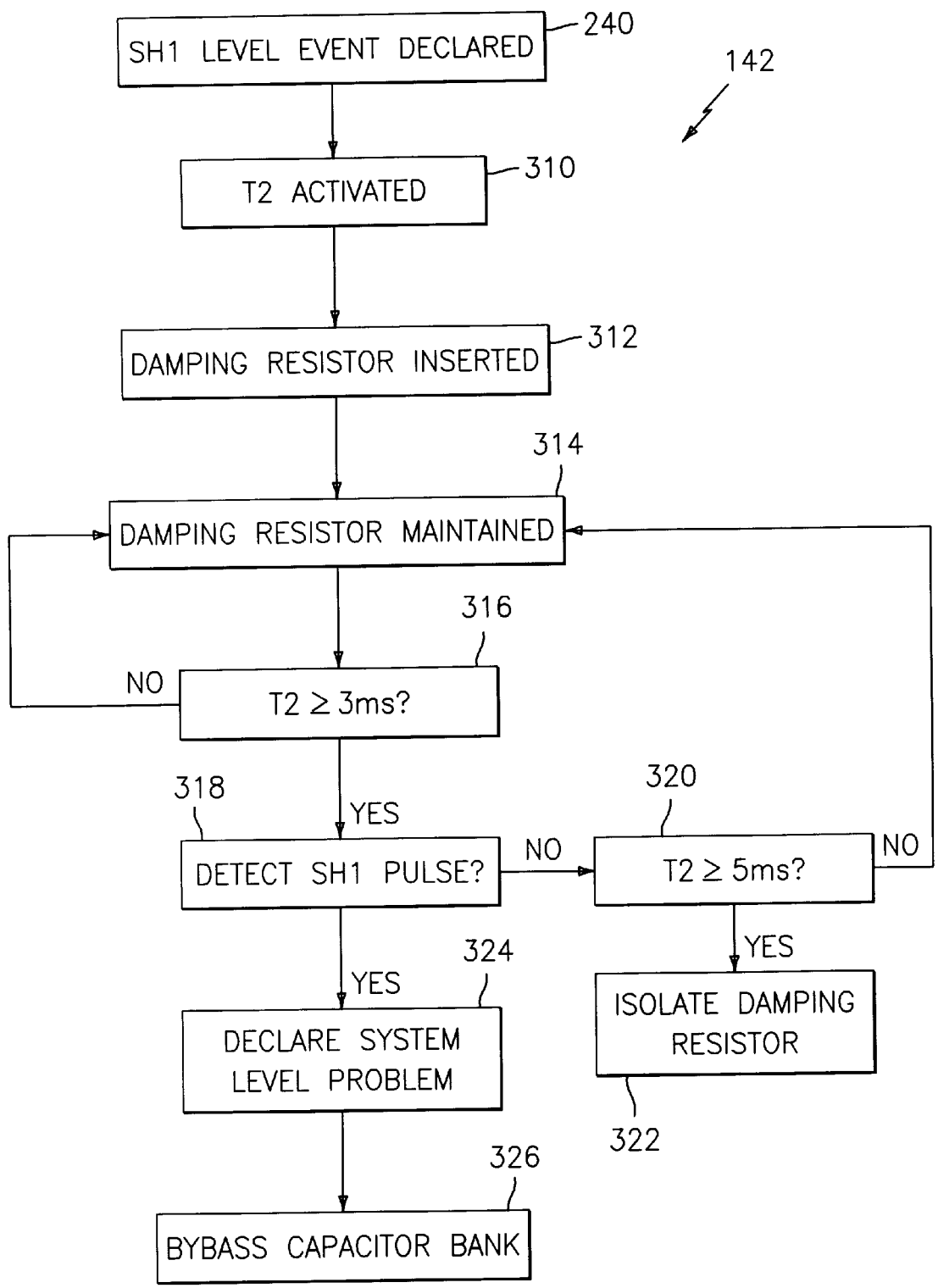
FIG. 3. Is a flow chart illustrating the operation of one embodiment of a SH1 level event control sequence.

Referring now to FIG. 3, there is illustrated a flowchart of one embodiment of a SH1 event control sequence. The control sequence illustrated in FIG. 3 may be embodied in a computer-readable storage medium containing instructions for carrying out the various steps. Upon the declaration of a SH1 event by the logical processor 140, the distribution series capacitor system controller 142 starts timer T2 at step 310 and immediately connects a damping resistor in parallel with the capacitor bank at step 312. The damping resistor is maintained in parallel at step 314 until T2 is equal (or greater than) 3 seconds (step 316). When T2 equals 3 seconds, the system controller proceeds to step 318 where it determines whether SH1 pulses are still being measured by the logical processor 140. If no SH1 pulses are detected, the controller proceeds to step 320 and determines whether T2≧5. If not, the controller returns to the maintenance step 314. If T2≧5, the controller proceeds to step 322, removes the damping resistor, and returns to normal operation. If, however, SH1 pulses are detected in step 318, the controller 142 declares a system level problem at step 324 and proceeds to bypass the capacitor bank at step 326 to prevent further damage to the system.

Figure 4:
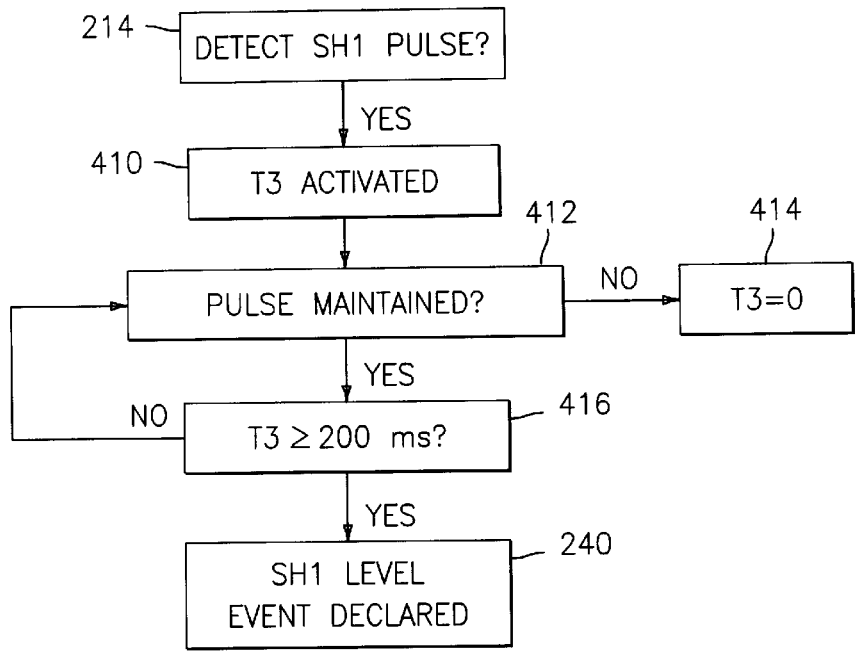
FIG. 4. Is a flow chart illustrating the operation of a SH1 level event failsafe sequence.
Figure 5:
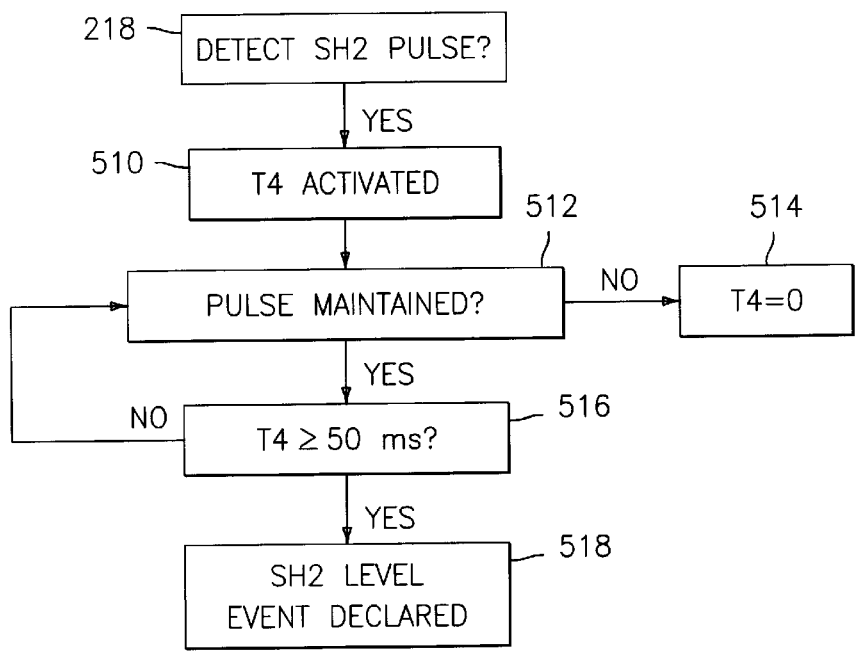
FIG. 5. Is a flow chart illustrating the operation of a SH2 level event failsafe sequence.
Figure 9:
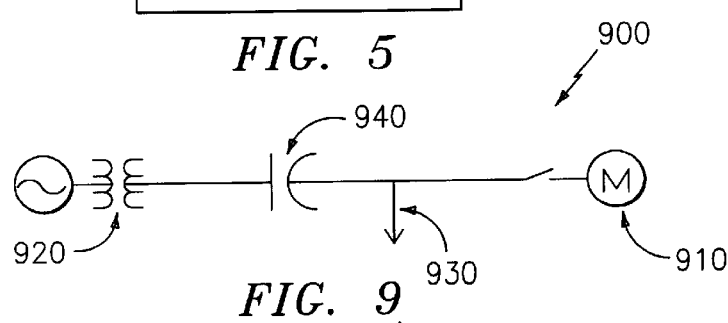
FIG. 9. illustrates a conventional voltage flicker problem in an electrical distribution system.

The possibility exists that under certain circumstances the sub-harmonic detection module could become effectively saturated by signals of significant magnitude, or by signals that are evenly distributed among the three phase inputs. In either of these two cases, the pulse train generated at the ferroresonant and self-excitation outputs 134 and 136 would become single, steady-state "on" inputs into the logical processor 140. Such a steady-state signal would simply be viewed as a single count and would not enable the declaration of either a SH1 (self-excitation) or SH2 (ferroresonant) event, even where such a declaration is appropriate. To remedy this problem, timers T3 and T4 may be utilized which begin upon the receipt of each and every SH1 and SH2 pulse, respectively. Referring now to FIGS. 4 and 5, there are shown flowcharts illustrating failsafe sub-harmonic event detection methods which occur parallel to the method of FIG. 2.

Upon detection of a SHI pulse in step 214, the processor proceeds to step 410 where timer T3 is activated. In step 412, the processor determines whether the pulse is maintained and, if not, proceeds to step 414, where timer T3 is reset to 0. If, however, the pulse is maintained, the processor proceeds to step 416 where it determines whether T3 is greater than or equal to some preset value, preferably 200 ms for an SH1 event. If T3≧200 ms, the processor proceeds to step 240 and declares a SH1 event. If not, the processor returns to step 412 to determine whether the pulse is still maintained. Similarly, referring to FIG. 5, upon detection of a SH2 pulse in step 218, timer T4 is started in step 510. It is determined in step 512 whether the pulse is maintained and, if not, time T4 is reset to 0 at step 514. If the pulse is maintained, it the processor proceeds to step 516 where it determines whether T4 is greater than or equal to some preset value, preferably 50 ms for an SH2 event. If T5≧50 ms, the processor proceeds to step 224 and declares a SH2 event. If not, the processor returns to step 512 to determine whether the pulse is still maintained. In this manner, if any SH1 or SH2 pulse drops out before its timer reaches a preset value, no action is taken and the processor 140 is permitted to operate normally. However, if a pulse remains "on" beyond the timer setting, a SH1 (self-excitation) event or SH2 (ferroresonant event) is declared depending upon the timer duration and the value of the signal voltage.

Figure 6:
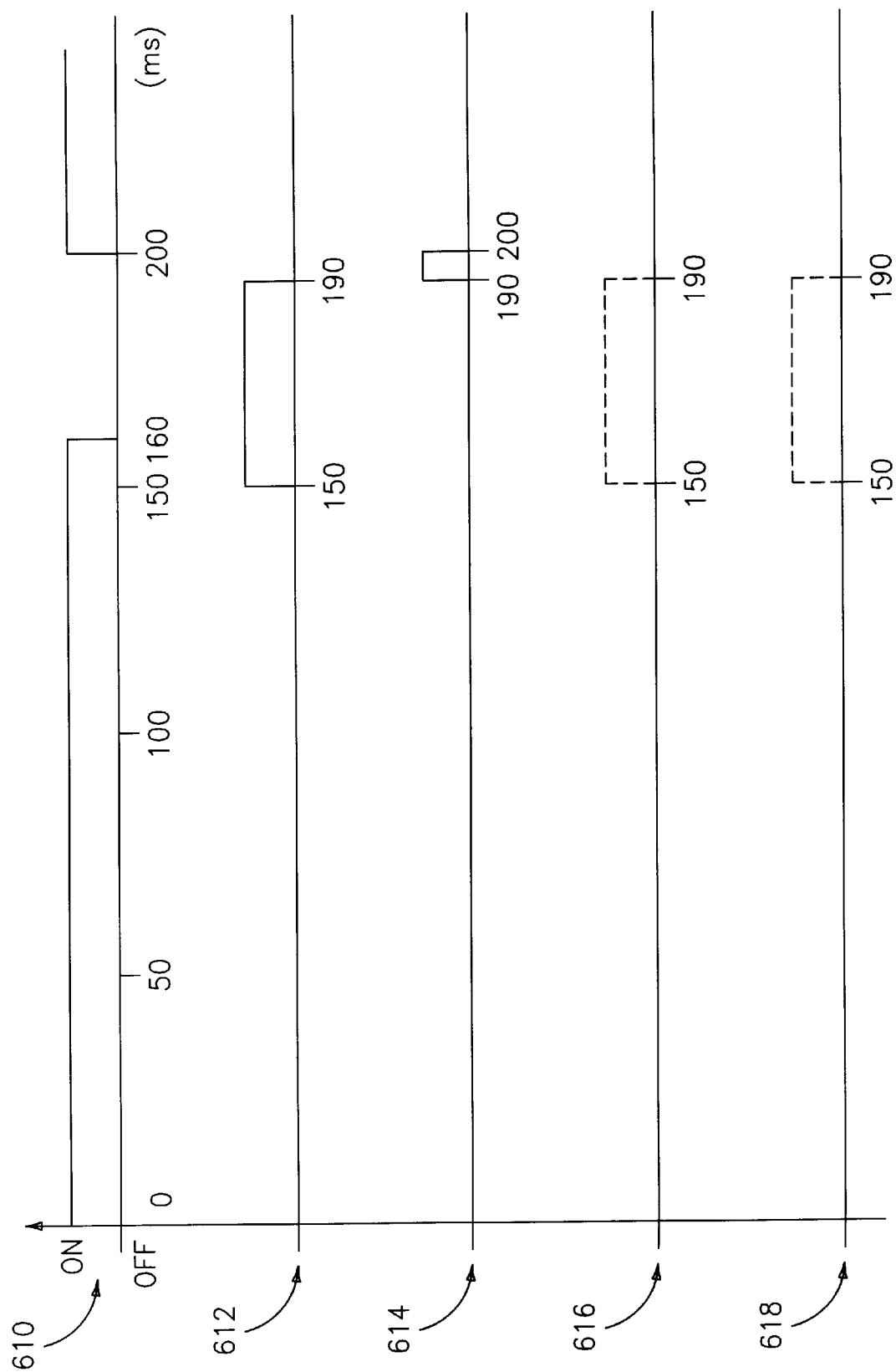
FIG. 6 is a graphical depiction of the sub-harmonic signal detection processing algorithm.

Referring now to FIG. 6, there is illustrated a graphical depiction of the sub-harmonic signal detection processing algorithm implemented by the process depicted in FIG. 2. The combined graphs of FIG. 6 disclose the various operational sequences of the processor 140 on a common time scale, generated as virtual outputs having either an "on" or an "off" state. Virtual output 610 represents the operation of timer T and can be seen to last for 160 ms of the 200 ms sequence duration. Virtual output 612 represents the comparison window which takes place between 150 and 190 ms during which the values of the counters CT1 and CT2 are evaluated. Virtual output 614 represents the reset period which takes place between 190 and 200 ms, during which the counters CT1 and CT2 are reset to 0. Virtual outputs 616 and 618 represents the action of counter CT3, during the period between 150 and 190 ms. If a SH1 pulse is detected during 0–190 ms, CT3 will be incremented as illustrated in virtual output 616. If no pulse is detected, CT3 is reset as illustrated in virtual output 618.

Figure 7:
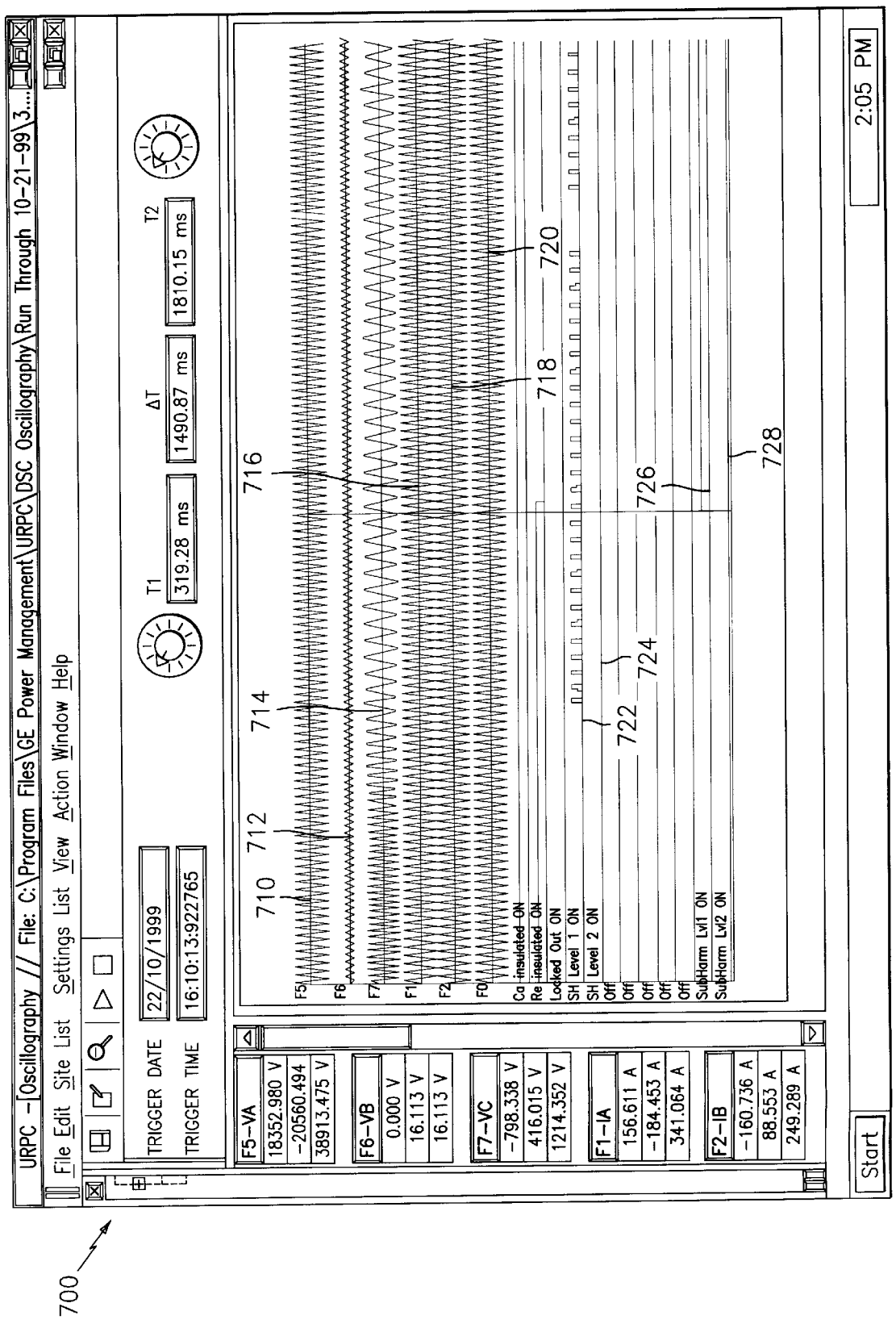
FIG. 7. illustrates one embodiment of a graphical user interface displaying system performance of a first test run.
Figure 8:
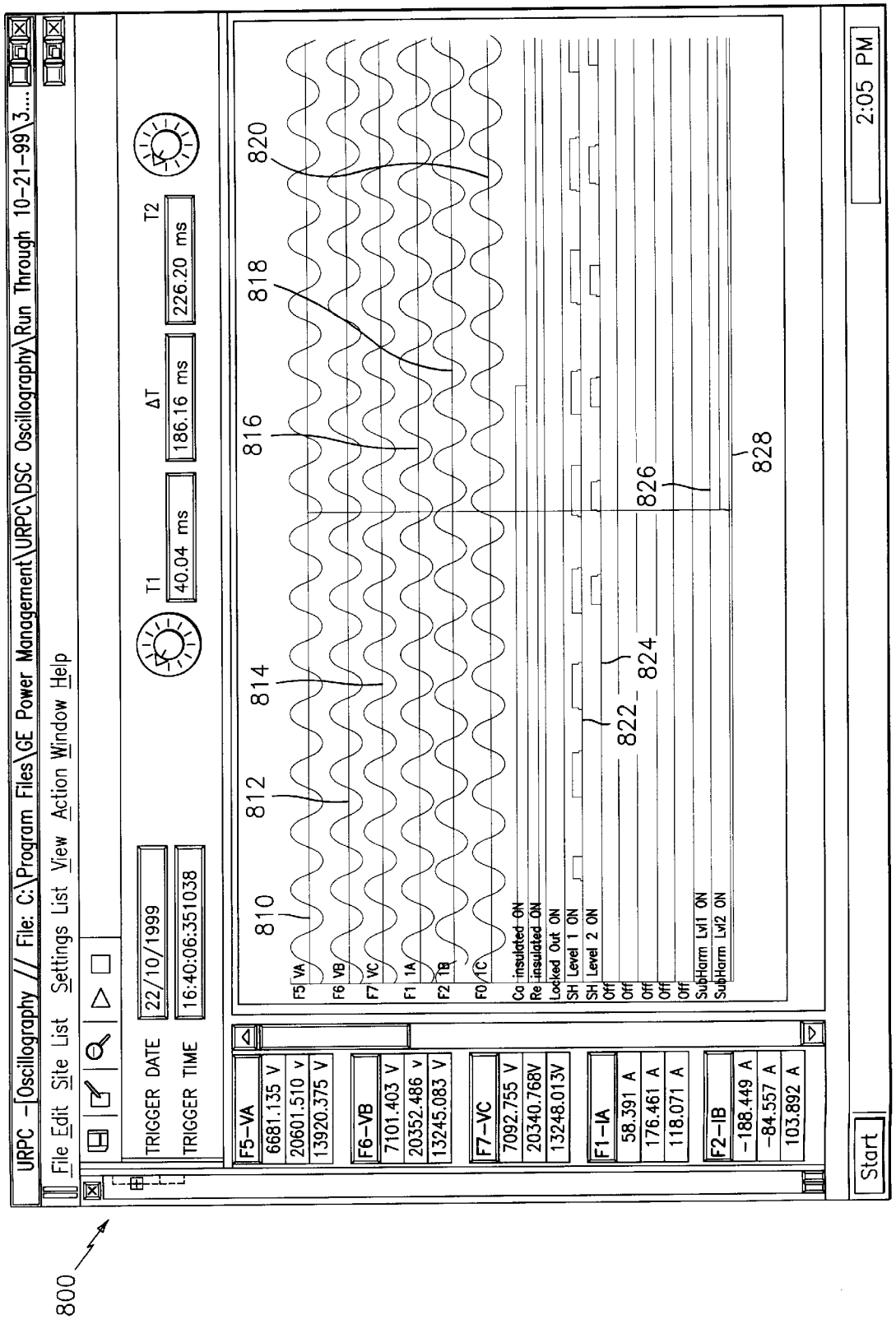
FIG. 8. illustrates a graphical user interface similar to that shown in FIG. 7, displaying system performance of a second test run.

Referring now to FIGS. 7 and 8, there is shown one embodiment of a graphical user interface (GUI) for displaying oscillography traces reflecting various environmental conditions and resulting system performance reactions. In FIG. 7, GUI 700 displays various elements of system performance including: line to ground voltage for each of the three phases on lines 710, 712, and 714; current flowing through the capacitor for each of the three phases on lines 716, 718, and 720, the SH1 signal on line 722, the SH2 signal on line 724, the SH1 level event alarm on line 726, and the SH2 level event alarm on line 728.

FIG. 7 displays the results of a SH1 level test wherein a signal generator was connected to the Phase B input of the sub-harmonic detection module. The waveform initially applied was an 8.5 Vpk, 60 Hz sinusoid signal that was rapidly ramped down to a 30 Hz signal as shown in line 712. When the frequency dropped below the 40 Hz threshold, line 722 indicates the corresponding SH1 pulses. After twelve SH1 pulses, the processor declares a SH1 level event, and triggers the event alarm on line 726, indicating the insertion of the damping resistor.

GUI 800 in FIG. 8 displays the results of a SH2 level test wherein a signal generator was connected to the Phase B input of the sub-harmonic detection module. Similar to GUI 700, GUI 800 also displays various elements of system performance including: line to ground voltage for each of the three phases on lines 810, 812, and 814; current flowing through the capacitor for each of the three phases on lines 816, 818, and 820, the SH1 signal on line 822, the SH2 signal on line 824, the SH1 level event alarm on line 826, and the SH2 level event alarm on line 828. The waveform initially applied was an 8.5 Vpk, 60 Hz sinusoid signal as shown in line 812. Because of limitations in the measuring equipment, a 30 Hz signal was necessarily applied directly at the divider midpoint 108 (see FIG. 1), rather than at input 102. This results in the 30 Hz signal not being displayed in FIG. 8. Hlowever, line 822 indicates the SH1 pulses corresponding to the 30 Hz signal. Line 824 indicates corresponding SH2 pulses. After the required two SH2 pulses in a single measuring period, the processor declares a SH2 level event, and triggers the event alarm on line 828, indicating the bypass of the capacitor bank by the system controller.

While the foregoing description includes many details and specificities, it is to be understood that these have been included for purposes of explanation only, and are not to be interpreted as limitations of the present invention. Many modifications to the embodiments described above can be made without departing from the spirit and scope of the invention, as is intended to be encompassed by the following claims and their legal equivalents.

What is claimed is:

1. A sub-harmonic detection and control system comprising:
   a sub-harmonic detection module connected to an input signal, said sub-harmonic detection module operable to detect a presence of at least two distinct types of sub-harmonic content in the input signal, a logical signal processor electrically connected to the sub-harmonic detection module, said logical signal processor operable to independently determine at least two distinct types of adverse phenomena associated with said at least two distinct types of sub-harmonic content, respectively, wherein said logical signal processor generates at least two output signals representative of said determinations, and a system controller electrically connected to the logical signal processor, said system controller responsive to said at least two output signals to eliminate effects of said two distinct types of adverse phenomena.

2. The sub-harmonic detection and control system of claim 1, wherein:

said at least two distinct types of sub-harmonic content include a first sub-harmonic content having a voltage greater than a first threshold voltage and a second sub-harmonic content having a voltage greater than a second threshold voltage.

3. The sub-harmonic detection and control system of claim 2, wherein:

said two distinct types of adverse phenomena include a self-excitation phenomenon associated with said first sub-harmonic content and a ferroresonance phenomenon associated with said second sub-harmonic content.

4. The sub-harmonic detection and control system of claim 3, wherein:

said at least two output signals include a first output signal representative of a self-excitation phenomenon determination and a second output signal representative of a ferroresonance phenomenon determination, said controller, in response to said first output signal, eliminates said self-excitation phenomenon, and said controller, in response to said second output signal, eliminates said ferroresonance phenomenon.

5. The sub-harmonic detection and control system of claim 1, wherein said sub-harmonic module includes:

a filter electrically connected to the input signal, said filter being operable to isolate said at least one type of sub-harmonic content of the input signal, a first comparator electrically connected to the filter, said first comparator generating a first output signal when a voltage of the sub-harmonic content exceeds a first threshold voltage, a second comparator electrically connected to the filter, said second comparator generating a second output signal when the voltage of the sub-harmonic component exceeds a second threshold voltage, and first and second outputs electrically connected to the first and second comparators, respectively.

6. The sub-harmonic detection and control system of claim 5, wherein:

said first threshold voltage is lower than said second threshold voltage.

7. A sub-harmonic detection and control system for use with an electrical distribution system having a bank of series-connected capacitors, comprising:

a sub-harmonic detection module including at least one input that receives an input signal, at least one filter electrically connected to the at least one input that isolates a sub-harmonic component of the input signal, a first comparator electrically connected to the at least one filter for generating a first output signal when a voltage of the sub-harmonic component exceeds a first threshold value, a second comparator electrically connected to the at least one filter for generating a second output signal when the voltage of the sub-harmonic component exceeds a second threshold value, and first and second outputs electrically connected to the first and second comparators, respectively, a logical signal processor electrically connected to said first and second outputs, said logical signal processor receives said first and second output signals, wherein said logical signal processor, upon receipt of said first output signal, acts to determine a presence of a first distinct event associated with said first output signal, and wherein said logical signal processor, upon receipt of said second output signal, acts to determine a presence of a second distinct event associated with said second output signal, a system controller electrically connected to the logical signal processor, wherein said system controller is operable, in response to a determination of said first distinct event, to insert a damping resistor in parallel with said bank of series-connected capacitors, and wherein said system controller is further operable, upon receipt of a determination of said second distinct event, to bypass said bank of series-connected capacitors.

8. A method for detecting and controlling sub-harmonic signal content in an electrical distribution system comprising the steps of:

detecting the presence of at least two distinct types of sub-harmonic content in an input signal, determining the presence of at least two distinct types of adverse phenomena associated with said at least two distinct types of sub-harmonic content, and controlling the electrical distribution system to eliminate effects of said at least two distinct types of adverse phenomena.

9. The method of claim 8, wherein the step of determining the presence of at least two distinct types of sub-harmonic content includes:

determining the presence of a first sub-harmonic content having a voltage greater than a first threshold voltage, and determining the presence of a second sub-harmonic content having a voltage greater than a second threshold voltage.

10. The method of claim 9, wherein the step of determining the presence of at least two distinct types of adverse phenomena includes:

determining the presence of a self-excitation phenomenon associated with the first sub-harmonic content, and determining the presence of a ferroresonance phenomenon associated with the second sub-harmonic content.

11. The method of claim 10, further including the steps of:

controlling the electrical distribution system to eliminate effects of said self-excitation phenomenon, and controlling the electrical distribution system to eliminate effects of said ferroresonance phenomenon.

12. A method for detecting and controlling sub-harmonic signal content in a distribution capacitor control system having a bank of series-connected capacitors, comprising the steps of:

isolating a sub-harmonic content of an input signal, comparing a voltage value of the sub-harmonic content to first and second distinct threshold voltages, generating a first output signal indicative of whether the voltage value of the sub-harmonic content exceeds the first threshold voltage, generating a second output signal indicative of whether the voltage value of the sub-harmonic content exceeds the second threshold voltage, processing the first and second output signals to determine the existence of first and second sub-harmonic phenomena, upon determining the existence of the first sub-harmonic phenomenon, controlling the system to eliminate the first sub-harmonic phenomenon, and upon determining the existence of the second sub-harmonic phenomenon, controlling the system to eliminate the second sub-harmonic phenomenon.

13. The method of claim 12, wherein:

the step of generating the first output signal includes generating a plurality of first pulses representative of sub-harmonic content peak voltage values that exceed the first threshold, and the step of generating the second output signal includes generating a plurality of second pulses representative of sub-harmonic content peak voltage values that exceed the second threshold.

14. The method of claim 12, wherein the step of processing the first and second output signals includes the following sub-steps:

initiating a timer to begin a sequence having a first portion and a second portion, counting the first pulses generated during the first or second portions of said sequence, counting the second pulses generated during the first or second portions of said sequence, generating a ferroresonance event signal when more than one second pulse is counted during the first or second portions, counting the number of successive sequences in which at least one first pulse is counted, and generating a self-excitation event signal when the number of successive sequences in which at least one first pulse is counted is at least 3.

15. The method of claim 13, wherein the sequence has a duration of approximately 200 ms, the first portion has a duration of approximately 150 ms; and the second portion has a duration of approximately 160 ms.

16. The method of claim 13, wherein the step of controlling the system to eliminate the first sub-harmonic phenomenon includes the sub-steps of:

inserting a damping resistor in parallel electronic relationship to the bank of series-connected capacitors, bypassing the bank of series connected capacitors when first pulses are detected approximately three seconds following the step of inserting the damping resistor; and isolating the damping resistor approximately five seconds following the step of inserting the damping resistor if first pulses are not detected within approximately three seconds following the step of inserting the damping resistor.

17. The method of claim 13, wherein the step of processing the first and second output signals includes the following sub-steps:

timing the duration of each first pulse, timing the duration of each second pulse, generating a self-excitation event signal when the duration of a first pulse exceeds a first count duration threshold; and generating a ferroresonance event signal when the duration of a second pulse exceeds a second count duration threshold.

18. The method of claim 16, wherein the first count duration threshold is longer than the second count duration threshold.

19. The method of claim 17, wherein the first count duration threshold is approximately 200 ms and the second count duration threshold is approximately 50 ms.

20. The method of claim 9 including the further step of displaying information regarding the processing step.

21. A computer readable medium incorporating instructions for determining ferroresonance and self-excitation events, the instructions comprising:

starting a timer to begin a sequence having a first portion and a second portion, counting a number of first pulses representative of a first sub-harmonic content received during the first or second portions, counting a number of second pulses representative of a second sub-harmonic content received during the first or second portions, counting a number of second pulses representative of a second sub-harmonic content received during the first or second portions, generating a ferroresonance event signal when more than one second pulse is counted during the first or second portions, counting the number of successive sequences in which at least one first pulse is counted, and generating a self-excitation event signal when the number of successive sequences in which at least one first pulse is counted is at least 3.

22. A computer readable medium incorporating instructions for controlling a system to eliminate a first sub-harmonic phenomenon, the instructions comprising:

receiving an output signal indicating a first sub-harmonic event, inserting a damping resistor in parallel electronic relationship to a bank of series-connected capacitors, bypassing the bank of series connected capacitors when the sub-harmonic event persists approximately three seconds following the insertion of the damping resistor, and isolating the damping resistor approximately five second following the insertion of the damping resistor when the sub-harmonic event discontinues within approximately three seconds following the insertion of the damping resistor.

* * * * *